United States Patent
Takenaka

(10) Patent No.: US 10,367,455 B2
(45) Date of Patent: Jul. 30, 2019

(54) HIGH-FREQUENCY FRONT END CIRCUIT

(71) Applicant: Murata Manufacturing Co., Ltd., Kyoto (JP)

(72) Inventor: Isao Takenaka, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 15/978,823

(22) Filed: May 14, 2018

(65) Prior Publication Data
US 2018/0337638 A1 Nov. 22, 2018

(30) Foreign Application Priority Data
May 16, 2017 (JP) .................. 2017-097220

(51) Int. Cl.
| | |
|---|---|
| H03F 1/26 | (2006.01) |
| H03F 1/56 | (2006.01) |
| H03F 3/19 | (2006.01) |
| H03F 3/24 | (2006.01) |
| H04B 1/40 | (2015.01) |
| H03F 3/195 | (2006.01) |

(52) U.S. Cl.
CPC ............. *H03F 1/26* (2013.01); *H03F 1/56* (2013.01); *H03F 3/19* (2013.01); *H03F 3/195* (2013.01); *H03F 3/245* (2013.01); *H04B 1/40* (2013.01); *H03F 2200/165* (2013.01); *H03F 2200/171* (2013.01); *H03F 2200/222* (2013.01); *H03F 2200/255* (2013.01); *H03F 2200/318* (2013.01); *H03F 2200/387* (2013.01); *H03F 2200/451* (2013.01)

(58) Field of Classification Search
CPC ..... H03F 1/26; H03F 1/56; H03F 3/19; H03F 3/195; H03F 3/245; H03F 2200/165; H03F 2200/171; H03F 2200/222; H03F 2200/255; H03F 2200/318; H03F 2200/387; H03F 2200/451; H04B 1/40

See application file for complete search history.

(56) References Cited

U.S. PATENT DOCUMENTS

| | | | |
|---|---|---|---|
| 9,402,314 B2 | 7/2016 | Maruyama | |
| 2013/0223565 A1* | 8/2013 | McCallister | ...... H04L 25/03343 375/297 |
| 2015/0097619 A1* | 4/2015 | Kawano | .................. H03F 1/32 330/149 |

FOREIGN PATENT DOCUMENTS

JP 2014-116844 A 6/2014

* cited by examiner

*Primary Examiner* — Nguyen T Vo
(74) *Attorney, Agent, or Firm* — Pearne & Gordon LLP

(57) ABSTRACT

A high-frequency front end circuit includes an antenna terminal, a reception circuit that is directly or indirectly connected to the antenna terminal, and a transmission circuit that is directly or indirectly connected to the antenna terminal, wherein the transmission circuit has an amplification circuit, the amplification circuit includes an input terminal and an output terminal, an amplification element provided on a path connecting the input terminal and the output terminal, and a bias circuit having an LC resonance circuit and connected to between the amplification element and the output terminal. A frequency pass band of the transmission circuit is lower than a frequency pass band of the reception circuit, and a value of a resonant frequency of the bias circuit is smaller than a value of a frequency pass band width of the transmission circuit.

6 Claims, 8 Drawing Sheets

HIGH-FREQUENCY FRONT END CIRCUIT

This application claims priority from Japanese Patent Application No. 2017-097220 filed on May 16, 2017. The content of this application is incorporated herein by reference in its entirety.

BACKGROUND

The present disclosure relates to a high-frequency front end circuit including a reception circuit and a transmission circuit having an amplification circuit. A high-frequency front end circuit including a reception circuit and a transmission circuit is provided in a communication apparatus such as a cellular phone. As an example of the transmission circuit of the high-frequency front end circuit of this type, Japanese Unexamined Patent Application Publication No. 2014-116844 discloses a transmission circuit having a plurality of power amplification circuits. The transmission circuit amplifies transmission signals having different frequency bands by the power amplification circuits corresponding to the respective transmission signals and outputs the transmission signals.

However, in the case in which the transmission circuit disclosed in Japanese Unexamined Patent Application Publication No. 2014-116844 is connected to a reception circuit with an antenna terminal interposed therebetween, for example, when a frequency band of the reception circuit is present so as to be adjacent to a frequency band of the transmission circuit, there is a problem that distortion components generated in the power amplification circuits of the transmission circuit leak to the side of the frequency band of the reception circuit, and frequency characteristics of the reception circuit are deteriorated.

BRIEF SUMMARY

Accordingly, the present disclosure suppresses leakage of a distortion component generated in a power amplification circuit of a transmission circuit to the side of a frequency band of a reception circuit in a high-frequency front end circuit in which the transmission circuit and the reception circuit are connected to an antenna terminal.

According to an embodiment of the present disclosure, a high-frequency front end circuit includes an antenna terminal, a reception circuit that is directly or indirectly connected to the antenna terminal, and a transmission circuit that is directly or indirectly connected to the antenna terminal, wherein the transmission circuit has an amplification circuit, the amplification circuit includes an input terminal and an output terminal, an amplification element provided on a path connecting the input terminal and the output terminal, and a bias circuit having an LC resonance circuit and connected to at least one of between the amplification element and the output terminal and between the input terminal and the amplification element, a frequency pass band of the transmission circuit is lower than a frequency pass band of the reception circuit, and a value of a resonant frequency of the bias circuit is smaller than a value of a frequency pass band width of the transmission circuit.

This configuration can cancel odd-numbered order intermodulation distortion which is generated at the high frequency side of a transmission signal. Therefore, generation of leakage power at the high frequency side of the transmission signal, that is, the side of the frequency band of the reception circuit can be suppressed.

According to another embodiment of the present disclosure, a high-frequency front end circuit includes an antenna terminal, a reception circuit that is directly or indirectly connected to the antenna terminal, and a transmission circuit that is directly or indirectly connected to the antenna terminal, wherein the transmission circuit has an amplification circuit, the amplification circuit includes an input terminal and an output terminal, an amplification element provided on a path connecting the input terminal and the output terminal, and a bias circuit having an LC resonance circuit and connected to at least one of between the amplification element and the output terminal and between the input terminal and the amplification element, a frequency pass band of the transmission circuit is higher than a frequency pass band of the reception circuit, and a value of a resonant frequency of the bias circuit is larger than a value of a frequency pass band width of the transmission circuit.

This configuration can cancel odd-numbered order intermodulation distortion which is generated at the low frequency side of a transmission signal. Therefore, generation of leakage power at the low frequency side of the transmission signal, that is, the side of the frequency band of the reception circuit can be suppressed.

The bias circuit may be connected to between the amplification element and the output terminal.

With this configuration, the bias circuit can be made to act on a signal that is output from the amplification circuit, and generation of leakage power at the side of the frequency band of the reception circuit can be suppressed efficiently.

Furthermore, the high-frequency front end circuit may further include an output matching circuit on a path connecting the amplification element and the output terminal, wherein the bias circuit is connected to between the amplification element and the output matching circuit.

With this configuration, a signal output from the amplification circuit can be output in a state of matching with a circuit or an element of an output destination.

According to still another embodiment of the present disclosure, a high-frequency front end circuit includes a reception circuit and a transmission circuit having a plurality of amplification circuits connected in multistage, wherein the amplification circuit that is the closest to an output side of the transmission circuit among the plurality of amplification circuits is the amplification circuit according to any one of the above-described paragraphs.

With this configuration, the bias circuit can be made to act on a signal that is output from the amplification circuit located at the most posterior side among the plurality of amplification circuits, and generation of leakage power at the side of the frequency band of the reception circuit can be suppressed efficiently.

Furthermore, each of the plurality of amplification circuits may be the amplification circuit according to any one of the above-described paragraphs.

Provision of the bias circuit in each of the amplification circuits as described above can increase control factors for suppressing generation of leakage power, thereby suppressing generation of the leakage power with high accuracy.

Other features, elements, characteristics and advantages of the present disclosure will become more apparent from the following detailed description of embodiments of the present disclosure with reference to the attached drawings.

DETAILED DESCRIPTION

First, description is made using, as an example, a high-frequency front end circuit in a comparative example.

The high-frequency front end circuit in the comparative example includes a reception circuit and a transmission circuit having an amplification circuit (not illustrated). In the high-frequency front end circuit in the comparative example, a frequency pass band of the transmission circuit is set to be at a lower frequency side relative to a frequency pass band of the reception circuit.

Figure 1:
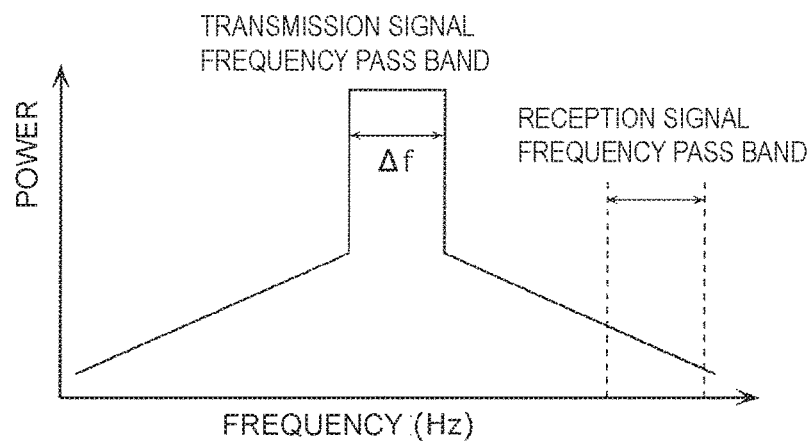
FIG. 1 is a schematic diagram illustrating an output signal spectrum of a transmission circuit of a high-frequency front end circuit in a comparative example.

FIG. 1 is a schematic diagram illustrating an output signal spectrum of the transmission circuit of the high-frequency front end circuit in the comparative example. FIG. 1 indicates an output signal of the transmission circuit having a frequency pass band width Δf when the amplification circuit amplifies a modulation signal.

In general, an output signal spectrum of a transmission circuit is set such that the high frequency side and the low frequency side are symmetric to each other with respect to a transmission signal frequency pass band, as illustrated in FIG. 1. However, input and output characteristics of the amplification circuit in the transmission circuit has nonlinearity. As electric power that is used in the transmission circuit is increased, non-linear distortion is generated and leakage power to the outside of the frequency pass band is generated. For this reason, when a reception signal frequency band is adjacent to a transmission signal frequency band, for example, there is a problem that the above-described leakage power enters the reception signal frequency band and reception quality of a reception circuit is deteriorated.

To cope with this problem, in a high-frequency front end circuit according to an embodiment of the present disclosure, an output signal spectrum of a transmission circuit is set such that the high frequency side and the low frequency side are asymmetric to each other with respect to a transmission signal frequency pass band. The output signal spectrum is made asymmetric by, for example, decreasing electric power at the high frequency side at the outside of the transmission signal frequency pass band (see FIG. 5). This asymmetric output signal spectrum can decrease leakage power entering a reception signal frequency band which is present at the high frequency side and suppress deterioration in reception quality. Hereinafter, the configuration for making the output signal spectrum of the transmission circuit be asymmetric will be described.

Hereinafter, embodiments of the present disclosure will be described in detail with reference to the embodiments and the drawings. It should be noted that all the embodiments which will be described below indicate comprehensive or specific examples. Numerical values, shapes, materials, components, arrangement and connection forms of the components, and the like which will be described in the following embodiments are examples and are not intended to limit the present disclosure. Components that are not described in the independent claims of the disclosure among the components in the following embodiments are described as arbitrary components. The sizes or size ratios of the components illustrated in the drawings are not necessarily strict.

First Embodiment

A high-frequency front end circuit 1 according to a first embodiment is a circuit for transmitting and receiving high-frequency signals (signals of approximately 700 MHz to 2700 MHz) in accordance with the long term evolution (LTE) standard, for example.

Figure 2:
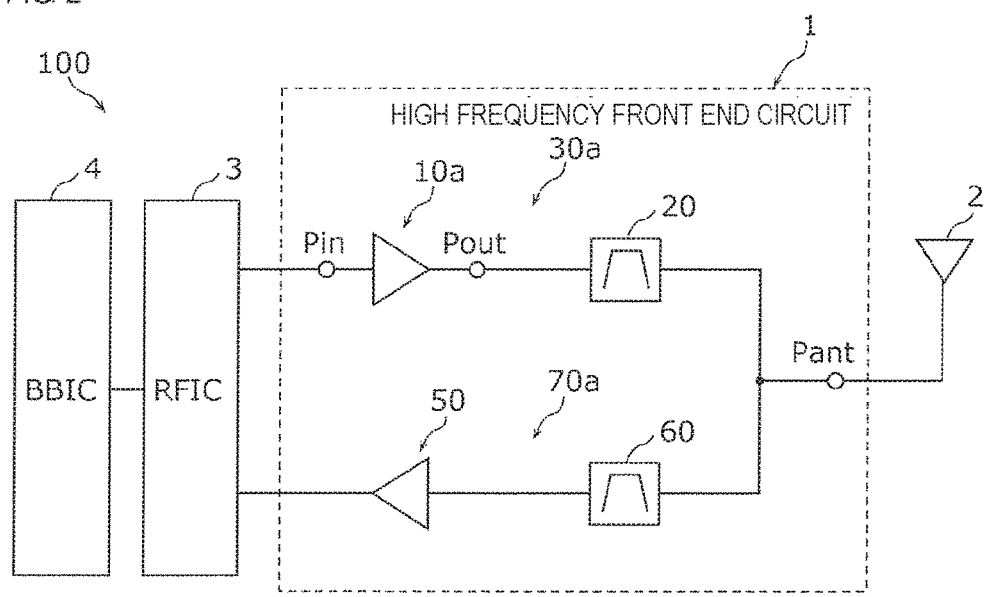
FIG. 2 is a functional block diagram of a high-frequency front end circuit according to a first embodiment.

FIG. 2 is a functional block diagram of the high-frequency front end circuit 1. FIG. 2 illustrates a communication apparatus 100 and an antenna element 2.

The communication apparatus 100 includes the high-frequency front end circuit 1, an RF signal processing circuit (RFIC) 3, and a baseband signal processing circuit (BBIC) 4. The high-frequency front end circuit 1 is arranged in, for example, a front end portion of a cellular phone.

The high-frequency front end circuit 1 includes a transmission circuit 30a having an amplification circuit 10a and a transmission filter 20, and a reception circuit 70a having a low noise amplifier circuit 50 and a reception filter 60.

Both of the transmission circuit 30a and the reception circuit 70a are electrically connected to an antenna terminal Pant. In the embodiment, the transmission circuit 30a and the reception circuit 70a are directly connected to the antenna terminal Pant.

In the embodiment, a frequency pass band of the transmission circuit 30a is set to be lower than a frequency pass band of the reception circuit 70a. For example, the frequency pass band of the transmission circuit 30a is equal to or higher than approximately 704 MHz and equal to or lower than approximately 716 MHz and the frequency pass band of the reception circuit 70a is equal to or higher than approximately 734 MHz and equal to or lower than approximately 746 MHz.

The amplification circuit 10a configures a power amplifier that amplifies a high-frequency transmission signal output from the RF signal processing circuit 3 and outputs the amplified high-frequency transmission signal to the transmission filter 20. The amplification circuit 10a is a primary part of the present disclosure and details thereof will be described later.

The transmission filter 20 is a transmission filter element that filters the transmission signal output from the amplification circuit 10a by a predetermined pass band and outputs the transmission signal to the antenna element 2 with the antenna terminal Pant interposed therebetween. The transmission filter 20 is, for example, a surface acoustic wave (SAW) filter.

The reception filter 60 is a reception filter element that inputs a reception signal received by the antenna element 2 with the antenna terminal Pant interposed therebetween, filters the reception signal by a predetermined pass band, and outputs it to the low noise amplifier circuit 50. The reception filter 60 is, for example, an SAW filter.

The low noise amplifier circuit 50 configures a low noise amplifier that amplifies a high-frequency reception signal output from the reception filter 60 and outputs the amplified high-frequency reception signal to the RF signal processing circuit 3.

The RF signal processing circuit 3 is, for example, a radio frequency integrated circuit (RFIC). The RF signal processing circuit 3 performs signal processing on a transmission signal input from the baseband signal processing circuit 4 by up conversion or the like, and outputs a high-frequency transmission signal generated by the signal processing to the amplification circuit 10a. Furthermore, the RF signal processing circuit 3 performs signal processing on a high-frequency reception signal input from the antenna element 2 while passing through a reception-side signal path by down conversion or the like, and outputs a reception signal generated by the signal processing to the baseband signal processing circuit 4.

The baseband signal processing circuit 4 is a circuit that performs signal processing using an intermediate frequency band that is lower than the frequency of the high-frequency signal in the high-frequency front end circuit 1.

Figure 3:
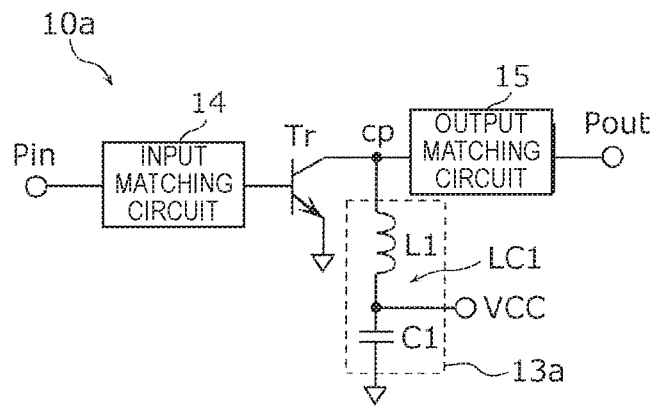
FIG. 3 is a circuit configuration diagram of an amplification circuit included in a transmission circuit of the high-frequency front end circuit according to the first embodiment.

FIG. 3 is a circuit configuration diagram of the amplification circuit 10a included in the transmission circuit 30a of the high-frequency front end circuit 1.

The amplification circuit 10a has an input terminal Pin, an input matching circuit 14, an amplification element Tr, a bias circuit 13a, an output matching circuit 15, and an output terminal Pout.

The amplification element Tr is provided on a path connecting the input terminal Pin and the output terminal Pout. The amplification element Tr is a power amplification element that amplifies the transmission signal input from the input terminal Pin side and outputs the amplified transmission signal to the output terminal Pout side, and is, for example, a heterobipolar transistor or an electric field effect transistor.

The input matching circuit 14 is provided on a path connecting the input terminal Pin and the amplification element Tr. The input matching circuit 14 is a circuit that matches impedance at the RF signal processing circuit 3 side and impedance at the amplification element Tr side, and has, for example, a capacitor and an inductor.

The output matching circuit 15 is provided on a path connecting the amplification element Tr and the output terminal Pout. The output matching circuit 15 is a circuit that matches impedance at the amplification element Tr side and impedance at the transmission filter 20 side, and has, for example, a capacitor and an inductor.

The bias circuit 13a is a circuit that is connected to a connection point cp located between the amplification element Tr and the output matching circuit 15 and supplies a bias voltage to the amplification element Tr. The bias circuit 13a has an LC resonance circuit LC1 configured by series connection of an inductor L1 and a capacitor C1. The inductor L1 of the LC resonance circuit LC1 is connected to the connection point cp, the capacitor C1 is connected to the ground, and a power supply voltage Vcc is supplied to between the inductor L1 and the capacitor C1.

Figure 4:
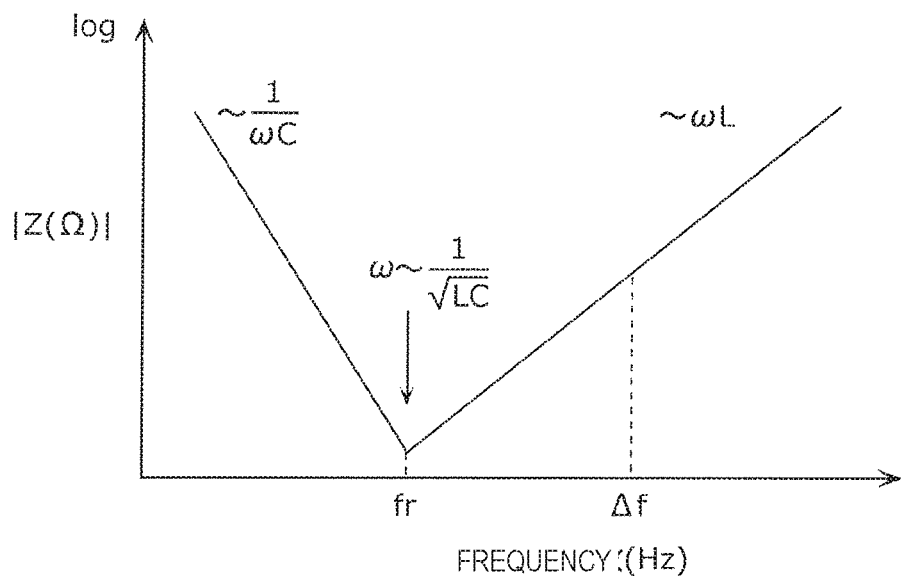
FIG. 4 is a schematic diagram illustrating impedance characteristics of a bias circuit included in the amplification circuit in the first embodiment.
Figure 5:
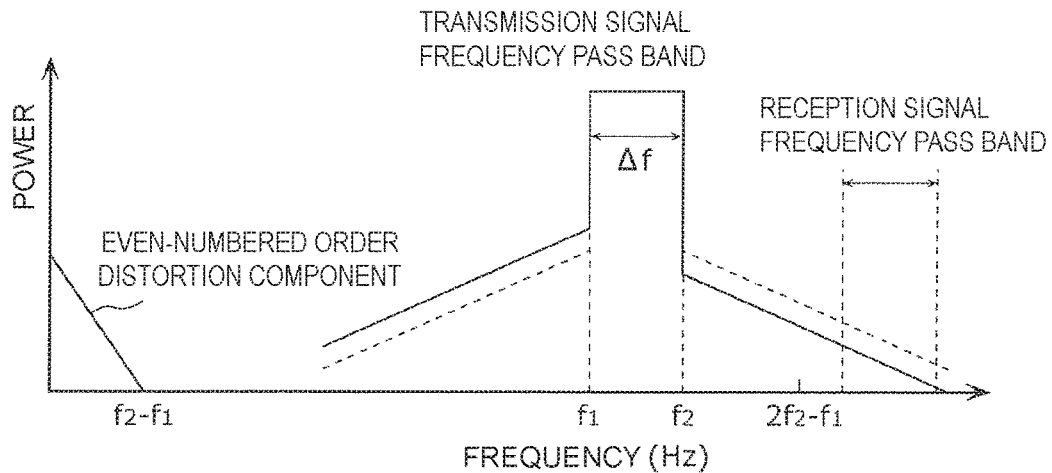
FIG. 5 is a schematic diagram illustrating an output signal spectrum of the transmission circuit in the first embodiment.

FIG. 4 is a schematic diagram illustrating impedance characteristics of the bias circuit 13a included in the amplification circuit 10a. FIG. 5 is a schematic diagram illustrating an output signal spectrum of the transmission circuit 30a. In FIGS. 4 and 5, a transmission signal frequency pass band width $\Delta f$ is $\Delta f = f_2 - f_1$ ($f_1 < f_2$). Hereinafter, the frequency pass band width $\Delta f$ is referred to as a band width $\Delta f$.

A resonant frequency fr of the bias circuit 13a having the LC resonance circuit LC1 is expressed by $fr = 1/(2\pi\sqrt{LC})$. Therefore, as illustrated in FIG. 4, the impedance of the bias circuit 13a is minimum at the resonant frequency fr and is inclined upward to the right toward the higher frequency side relative to the resonant frequency fr.

In the embodiment, a value of the resonant frequency fr of the bias circuit 13a is set to be smaller than a value of the band width $\Delta f$ of the transmission circuit 30a. In other words, the value of the band width $\Delta f$ is larger than the value of the resonant frequency fr and the impedance of the bias circuit 13a is a large value in a state in which an inductor component is dominant. The above-described impedance setting in the bias circuit 13a can superimpose an even-numbered order distortion component which is generated at the low frequency side (for example, $f_2 - f_1$) at the outside of the transmission signal frequency pass band on odd-numbered order intermodulation distortion which is generated at the high frequency side of the transmission signal (for example, $2f_2 - f_1$) in an opposite phase. Usage of the distortion component cancels the odd-numbered order intermodulation distortion of the transmission signal and leakage power which is generated at the high frequency side of the transmission signal can be suppressed, as illustrated in FIG. 5.

For example, when the value of the resonant frequency fr and the value of the band width $\Delta f$ are set to be the same, the output signal spectrum becomes symmetric as illustrated in FIG. 1 and the leakage power which is generated at the high frequency side of the transmission signal is increased. By contrast, when the value of the resonant frequency fr is set to be smaller than the value of the band width $\Delta f$ as in the embodiment, the odd-numbered order intermodulation distortion at the high frequency side of the transmission signal is canceled and the output signal spectrum becomes asymmetric. This asymmetric output signal spectrum can suppress the leakage power which is generated in the reception signal frequency band present at the high frequency side of the transmission signal.

That is to say, the high-frequency front end circuit 1 in the embodiment includes the reception circuit 70a and the transmission circuit 30a having the amplification circuit 10a, wherein the amplification circuit 10a includes the input terminal Pin and the output terminal Pout, the amplification element Tr provided on the path connecting the input terminal Pin and the output terminal Pout, and the bias circuit 13a having the LC resonance circuit LC1 and connected to between the amplification element Tr and the output terminal Pout. The frequency pass band of the transmission circuit 30a is lower than the frequency pass band of the reception circuit 70a and the value of the resonant frequency fr of the bias circuit 13a is smaller than the value of the band width $\Delta f$ of the transmission circuit 30a.

The high-frequency front end circuit 1 has the above-described configuration, so that the odd-numbered order intermodulation distortion which is generated at the high frequency side of the transmission signal can be canceled using the even-numbered order distortion component which is generated at the low frequency side at the outside of the transmission signal frequency pass band. Therefore, generation of the leakage power at the high frequency side of the transmission signal, that is, the side of the frequency band of the reception circuit can be suppressed.

Second Embodiment

In a high-frequency front end circuit 1A according to a second embodiment, a reception signal frequency band is set to be present at the lower frequency side relative to a transmission signal frequency band.

Figure 6:
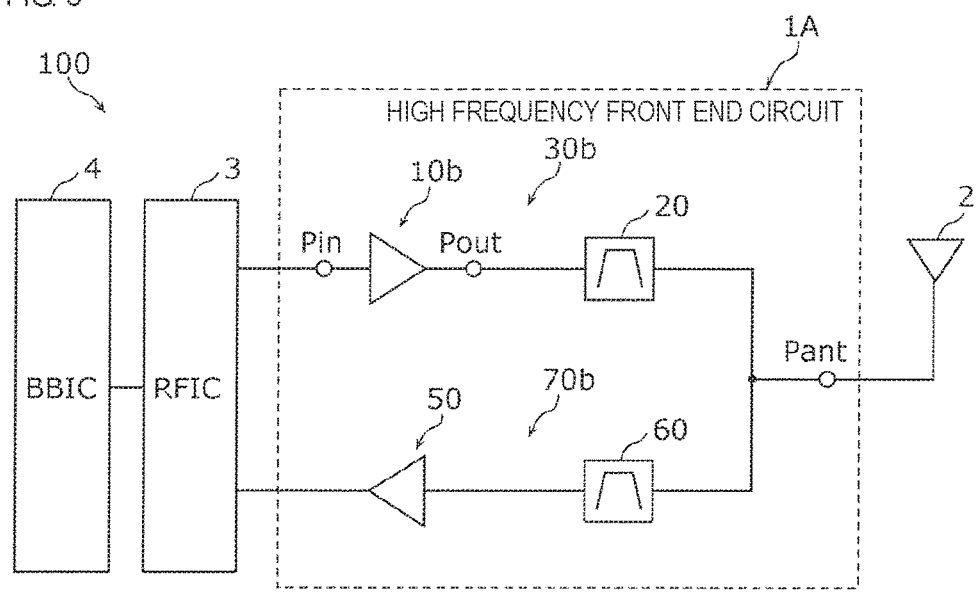
FIG. 6 is a functional block diagram of a high-frequency front end circuit according to a second embodiment.

FIG. 6 is a functional block diagram of the high-frequency front end circuit 1A. FIG. 6 illustrates the communication apparatus 100 and the antenna element 2.

The communication apparatus 100 includes the high-frequency front end circuit 1A, the RF signal processing circuit (RFIC) 3, and the baseband signal processing circuit (BBIC) 4. The high-frequency front end circuit 1A is arranged in, for example, a front end portion of a cellular phone.

The high-frequency front end circuit 1A includes a transmission circuit 30b having an amplification circuit 10b and the transmission filter 20, and a reception circuit 70b having the low noise amplifier circuit 50 and the reception filter 60.

Both of the transmission circuit 30b and the reception circuit 70b are electrically connected to the antenna terminal Pant. In the embodiment, the transmission circuit 30b and the reception circuit 70b are directly connected to the antenna terminal Pant.

In the embodiment, a frequency pass band of the transmission circuit 30b is set to be higher than a frequency pass band of the reception circuit 70b. To be specific, in the high-frequency front end circuit 1A, a reception signal frequency band is set to be present at the lower frequency side relative to a transmission signal frequency band so as to be adjacent thereto.

The amplification circuit 10b configures a power amplification circuit that amplifies a high-frequency transmission signal output from the RF signal processing circuit 3 and outputs the amplified high-frequency transmission signal to the transmission filter 20.

The transmission filter 20 is a transmission filter element that filters a transmission signal output from the amplification circuit 10b in a predetermined pass band and outputs the transmission signal to the antenna element 2 with the antenna terminal Pant interposed therebetween.

The reception filter 60 is a reception filter element that inputs a reception signal received by the antenna element 2 with the antenna terminal Pant interposed therebetween, filters the reception signal in a predetermined pass band, and outputs it to the low noise amplifier circuit 50.

The low noise amplifier circuit 50 is a high-frequency amplification circuit that amplifies a high-frequency reception signal output from the reception filter 60 and outputs the amplified high-frequency reception signal to the RF signal processing circuit 3.

The RF signal processing circuit 3 performs signal processing on a transmission signal input from the baseband signal processing circuit 4 by up conversion or the like, and outputs a high-frequency transmission signal generated by the signal processing to the amplification circuit 10b. The RF signal processing circuit 3 performs signal processing on a high-frequency reception signal input from the antenna element 2 while passing through a reception-side signal path by down conversion or the like, and outputs a reception signal generated by the signal processing to the baseband signal processing circuit 4.

The baseband signal processing circuit 4 is a circuit that performs signal processing using an intermediate frequency band that is lower than the frequency of the high-frequency signal in the high-frequency front end circuit 1A.

Figure 7:
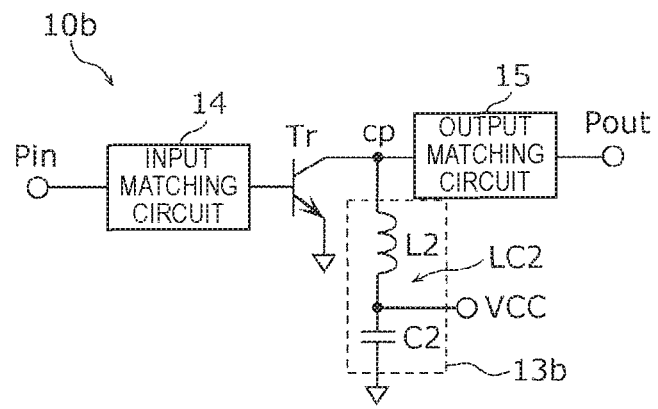
FIG. 7 is a circuit configuration diagram of an amplification circuit included in a transmission circuit of the high-frequency front end circuit according to the second embodiment.

FIG. 7 is a circuit configuration diagram of the amplification circuit 10b included in the transmission circuit 30b of the high-frequency front end circuit 1A.

The amplification circuit 10b has the input terminal Pin, the input matching circuit 14, the amplification element Tr, a bias circuit 13b, the output matching circuit 15, and the output terminal Pout.

The amplification element Tr is provided on a path connecting the input terminal Pin and the output terminal Pout. The amplification element Tr is a power amplification element that amplifies the transmission signal input from the input terminal Pin side and outputs the amplified transmission signal to the output terminal Pout side.

The input matching circuit 14 is provided on a path connecting the input terminal Pin and the amplification element Tr. The input matching circuit 14 is a circuit that matches impedance at the RF signal processing circuit 3 side and impedance at the amplification element Tr side.

The output matching circuit 15 is provided on a path connecting the amplification element Tr and the output terminal Pout. The output matching circuit 15 is a circuit that matches impedance at the amplification element Tr side and impedance at the transmission filter 20 side.

The bias circuit 13b is a circuit that is connected to the connection point cp located between the amplification element Tr and the output matching circuit 15 and supplies a bias voltage to the amplification element Tr. The bias circuit 13b has an LC resonance circuit LC2 configured by series connection of an inductor L2 and a capacitor C2. The inductor L2 of the LC resonance circuit LC2 is connected to the connection point cp, the capacitor C2 is connected to the ground, and the power supply voltage Vcc is supplied to between the inductor L2 and the capacitor C2.

Figure 8:
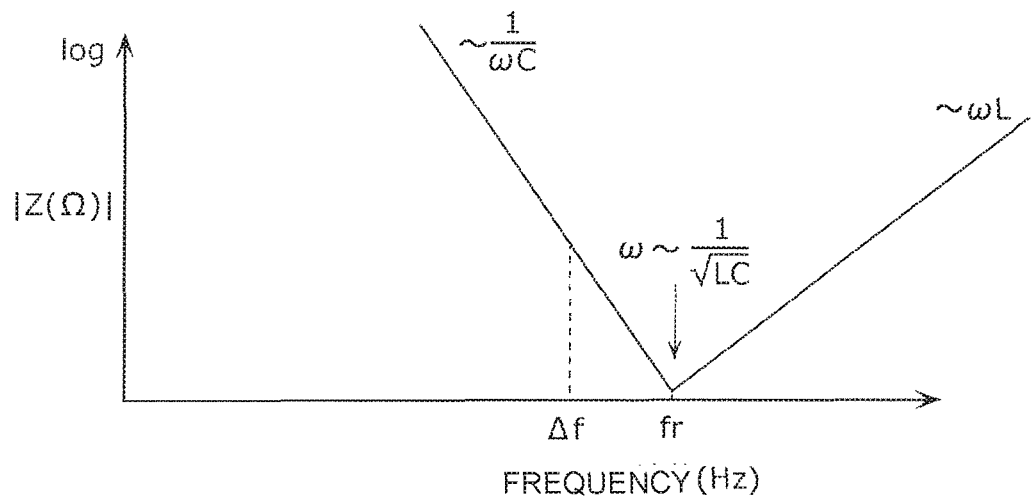
FIG. 8 is a schematic diagram illustrating impedance characteristics of a bias circuit included in the amplification circuit in the second embodiment.
Figure 9:
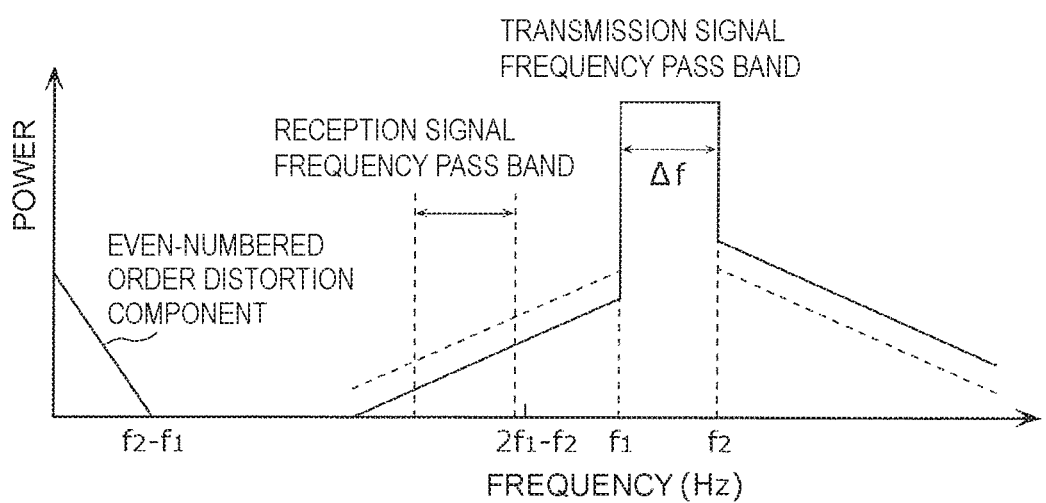
FIG. 9 is a schematic diagram illustrating an output signal spectrum of the transmission circuit in the second embodiment.

FIG. 8 is a schematic diagram illustrating impedance characteristics of the bias circuit 13b included in the amplification circuit 10b. FIG. 9 is a schematic diagram illustrating an output signal spectrum of the transmission circuit 30b. In FIGS. 8 and 9, a transmission signal band width $\Delta f$ is $\Delta f = f_2 - f_1$ ($f_1 < f_2$).

A resonant frequency fr of the bias circuit 13b having the LC resonance circuit LC2 is expressed by $fr = 1/(2\pi\sqrt{LC})$. Therefore, as illustrated in FIG. 8, the impedance of the bias circuit 13b is minimum at the resonant frequency fr and is inclined upward to the left toward the lower frequency side relative to the resonant frequency fr.

In the embodiment, a value of the resonant frequency fr of the bias circuit 13b is set to be larger than a value of the band width $\Delta f$ of the transmission circuit 30b. In other words, the value of the band width $\Delta f$ is smaller than the value of the resonant frequency fr and the impedance of the bias circuit 13b is a large value in a state in which a capacitor component is dominant. The above-described impedance setting in the bias circuit 13b can superimpose an even-numbered order distortion component which is generated at the low frequency side (for example, $f_2 - f_1$) at the outside of the transmission signal frequency pass band on odd-numbered order intermodulation distortion which is generated at the low frequency side of the transmission signal (for example, $2f_2 - f_1$) in an opposite phase. Usage of the distortion component cancels the odd-numbered order intermodulation distortion at the low frequency side of the transmission signal and leakage power which is generated at the low frequency side of the transmission signal can be suppressed, as illustrated in FIG. 9.

For example, when the value of the resonant frequency fr and the value of the band width Δf are set to be the same, the output signal spectrum becomes symmetric as illustrated in FIG. 1 and the leakage power which is generated at the low frequency side of the transmission signal is increased. By contrast, when the value of the resonant frequency fr is set to be larger than the value of the band width Δf as in the embodiment, the odd-numbered order intermodulation distortion which is generated at the low frequency side of the transmission signal is canceled and the output signal spectrum becomes asymmetric. This asymmetric output signal spectrum can suppress the leakage power which is generated in the reception signal frequency band present at the low frequency side of the transmission signal.

That is to say, the high-frequency front end circuit 1A in the embodiment includes the reception circuit 70b and the transmission circuit 30b having the amplification circuit 10b, wherein the amplification circuit 10b includes the input terminal Pin and the output terminal Pout, the amplification element Tr provided on the path connecting the input terminal Pin and the output terminal Pout, and the bias circuit 13b having the LC resonance circuit LC2 and connected to between the amplification element Tr and the output terminal Pout. The frequency pass band of the transmission circuit 30b is higher than the frequency pass band of the reception circuit 70b and the value of the resonant frequency fr of the bias circuit 13b is larger than the value of the band width Δf of the transmission circuit 30b.

The high-frequency front end circuit 1A has the above-described configuration, so that the odd-numbered order intermodulation distortion which is generated at the low frequency side of the transmission signal can be canceled using the even-numbered order distortion component which is generated at the low frequency side at the outside of the transmission signal frequency pass band. Therefore, generation of the leakage power at the low frequency side of the transmission signal, that is, the side of the frequency band of the reception circuit can be suppressed.

Third Embodiment

A high-frequency front end circuit 1B according to a third embodiment has the circuit configuration of the high-frequency front end circuit 1 in the first embodiment and the circuit configuration of the high-frequency front end circuit 1A in the second embodiment, and is configured so as to be used in multiband.

Figure 10:
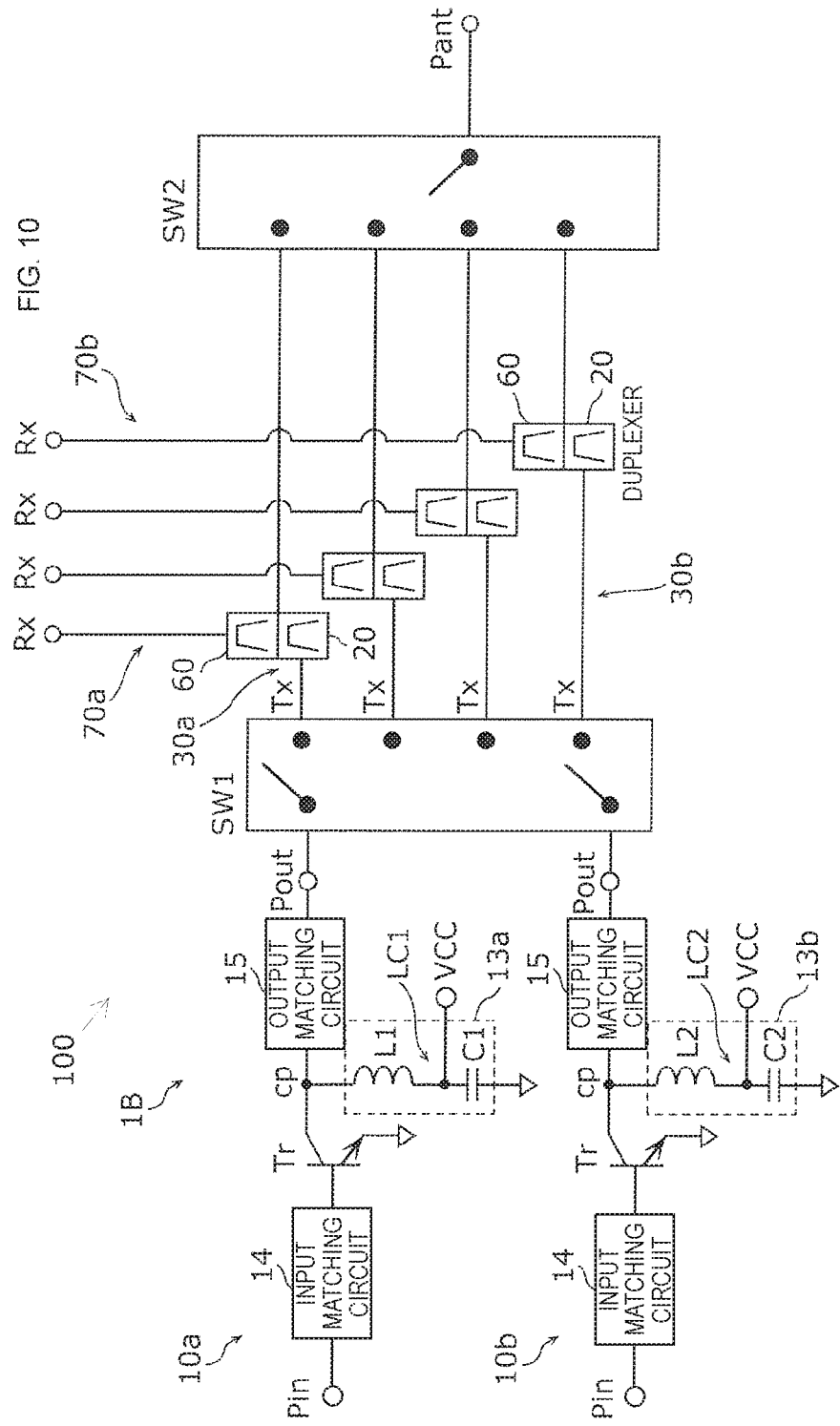
FIG. 10 is a functional block diagram of a high-frequency front end circuit according to a third embodiment.

FIG. 10 is a functional block diagram of the high-frequency front end circuit 1B.

The high-frequency front end circuit 1B includes the transmission circuit 30a and the reception circuit 70a in the first embodiment and the transmission circuit 30b and the reception circuit 70b in the second embodiment.

The transmission circuit 30a and the reception circuit 70a are indirectly connected to the antenna terminal Pant with a switch SW2 interposed therebetween. The transmission circuit 30b and the reception circuit 70b are indirectly connected to the antenna terminal Pant with the switch SW2 interposed therebetween.

In the third embodiment, a frequency pass band of the transmission circuit 30a is set to be lower than a frequency pass band of the reception circuit 70a, and a frequency pass band of the transmission circuit 30b is set to be higher than a frequency pass band of the reception circuit 70b.

The high-frequency front end circuit 1B includes a switch SW1 and the switch SW2. The switch SW1 is provided on a path connecting the amplification circuit 10a of the transmission circuit 30a and the transmission filter 20 and on a path connecting the amplification circuit 10b of the transmission circuit 30b and the transmission filter 20. The switch SW2 is provided on a path connecting a duplexer configured by the transmission filter 20 of the transmission circuit 30a and the reception filter 60 of the reception circuit 70a and the antenna terminal Pant and on a path connecting a duplexer configured by the transmission filter 20 of the transmission circuit 30b and the reception filter 60 of the reception circuit 70b and the antenna terminal Pant.

Either one of the transmission circuit 30a and the reception circuit 70a and the transmission circuit 30b and the reception circuit 70b is selected by switching the switch SW2 and the switch SW1. Both of the selected transmission circuit and the selected reception circuit are electrically connected to the antenna terminal Pant. Furthermore, the selected transmission circuit and the selected reception circuit are used as band processing circuits in the high-frequency front end circuit 1B. The switching is performed based on a control signal from a control IC mounted on the high-frequency front end circuit 1B, for example.

In the embodiment, the frequency pass band of the transmission circuit 30a is lower than the frequency pass band of the reception circuit 70a and the value of the resonant frequency fr of the bias circuit 13a of the amplification circuit 10a is smaller than the value of the band width Δf of the transmission circuit 30a. Therefore, when the transmission circuit 30a and the reception circuit 70a are selected with the switches SW1 and SW2, generation of leakage power at the high frequency side relative to the transmission signal frequency band can be suppressed.

Furthermore, in the embodiment, the frequency pass band of the transmission circuit 30b is higher than the frequency pass band of the reception circuit 70b and the value of the resonant frequency fr of the bias circuit 13b of the amplification circuit 10b is larger than the value of the band width Δf of the transmission circuit 30b. Therefore, when the transmission circuit 30b and the reception circuit 70b are selected with the switches SW1 and SW2, generation of leakage power at the low frequency side relative to the transmission signal frequency band can be suppressed.

Fourth Embodiment

In a high-frequency front end circuit 1 according to a fourth embodiment, an amplification circuit 10A is configured by amplification circuits in multistage.

Figure 11:
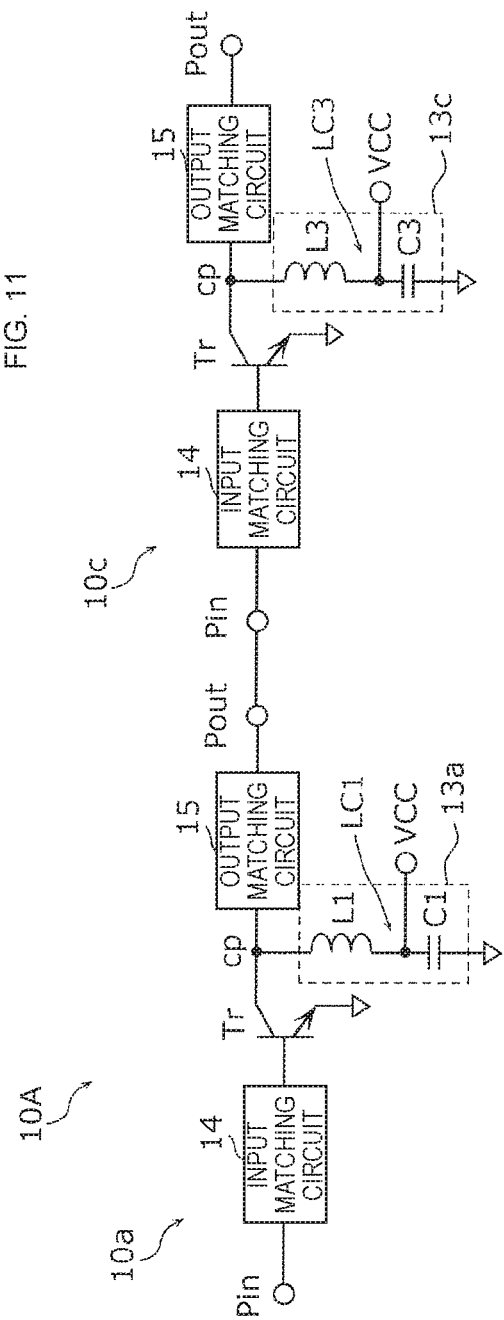
FIG. 11 is a circuit configuration diagram of an amplification circuit in a fourth embodiment.

FIG. 11 is a circuit configuration diagram of the amplification circuit 10A in the fourth embodiment.

The amplification circuit 10A has the amplification circuit 10a and an amplification circuit 10c connected in multistage. The amplification circuit 10c is located at a posterior stage relative to the amplification circuit 10a.

The amplification circuit 10c has the input terminal Pin, the input matching circuit 14, the amplification element Tr, a bias circuit 13c, the output matching circuit 15, and the output terminal Pout. The input terminal Pin of the amplification circuit 10c is connected to the output terminal Pout of the amplification circuit 10a located at an anterior stage. The output terminal Pout of the amplification circuit 10c is connected to the transmission filter 20. The output matching circuit 15 of the amplification circuit 10a and the input matching circuit 14 of the amplification circuit 10c may be integrated in either of them to form a matching circuit.

The bias circuit 13c is a circuit that is connected to the connection point cp located between the amplification element Tr and the output matching circuit 15 and supplies a bias voltage to the amplification element Tr. The bias circuit 13c has an LC resonance circuit LC3 configured by series connection of an inductor L3 and a capacitor C3. The inductor L3 of the LC resonance circuit LC3 is connected to the connection point cp, the capacitor C3 is connected to the ground, and the power supply voltage Vcc is supplied to between the inductor L3 and the capacitor C3. The bias circuit 13c is located at the closest position to the output side of the transmission circuit 30a.

The high-frequency front end circuit 1 in the embodiment includes the reception circuit 70a and the transmission circuit 30a having the amplification circuit 10A. The amplification circuit 10A is configured by the amplification circuit 10a and the amplification circuit 10c connected in multi-stage. A frequency pass band of the transmission circuit 30a is lower than a frequency pass band of the reception circuit 70a and a value of a resonant frequency fr of the bias circuit 13a is larger than a value of a frequency pass band width $\Delta f$ of the transmission circuit 30a. A value of a resonant frequency fr of the bias circuit 13c is larger than the value of the band width $\Delta f$ of the transmission circuit 30a.

The high-frequency front end circuit 1 has the above-described configuration, so that odd-numbered order intermodulation distortion which is generated at the high frequency side of the transmission signal can be canceled using an even-numbered order distortion component which is generated at the lower frequency side at the outside of the transmission signal frequency pass band. Therefore, generation of leakage power at the high frequency side of the transmission signal, that is, the side of the frequency band of the reception circuit can be suppressed.

(Other Modes)

Although the high-frequency front end circuits 1, 1A, and 1B according to the embodiments of the present disclosure have been described above, the present disclosure is not limited to the above-described embodiments. The present disclosure can also encompass modes obtained by adding the following variations on the above-described embodiments, for example.

Figure 12:
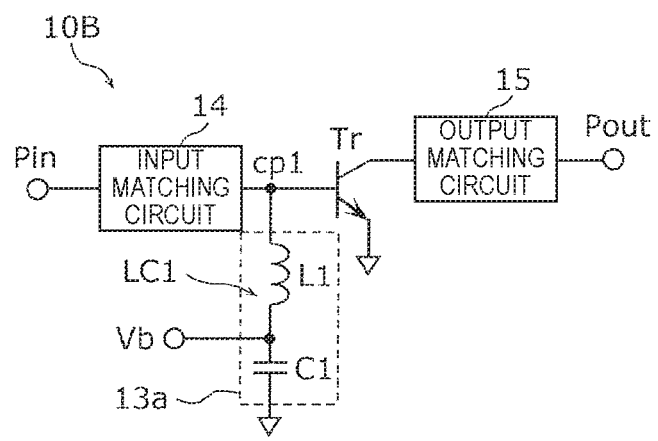
FIG. 12 is a circuit configuration diagram of an amplification circuit in another mode.

For example, the bias circuit 13a may be provided at the input side of the amplification element Tr as in an amplification circuit 10d illustrated in FIG. 12. To be specific, the bias circuit 13a may be connected to a connection point cp1 located between the input matching circuit 14 and the amplification element Tr. An input-side bias voltage Vb is supplied to between the inductor L1 and the capacitor C1. Even when the amplification circuit 10d is used instead of the amplification circuit 10a of the high-frequency front end circuit 1, effects obtained in the first embodiment can also be obtained.

Although the inductor L1 and the capacitor C1 in the LC resonance circuit LC1 are connected in series in the bias circuit 13a illustrated in FIG. 3, the LC resonance circuit is not limited thereto. The LC resonance circuit may be configured by connecting the inductor L1 and the capacitor C1 in parallel.

Furthermore, each of the high-frequency front end circuits 1 to 1B may include a transmission circuit and a reception circuit that transmit and receive signals in accordance with standards (for example, the W-CDMA standard) other than the LTE standard. Moreover, each of the transmission filter and the reception filter is not limited to the SAW filter and may be a bulk acoustic wave (BAW) filter.

Although each of the reception circuit connected to the antenna terminal and the transmission circuit connected to the antenna terminal is configured by the duplexer in the above description, each of them may be configured by a multiplexer.

The present disclosure can be widely used for communication apparatuses such as a cellular phone and a base station, as a high-frequency front end circuit that can suppress the leakage of the transmission signal amplified by the amplification circuit to the adjacent frequency band.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A high-frequency front end circuit comprising:
    an antenna terminal;
    a reception circuit that is connected to the antenna terminal; and
    a transmission circuit that is connected to the antenna terminal and that comprises a first amplification circuit, wherein the first amplification circuit comprises:
        an input terminal and an output terminal;
        an amplification element connected in a signal path between the input terminal and the output terminal; and
        a bias circuit having an LC resonance circuit, a first end of the bias circuit being connected to the signal path,
    wherein a frequency pass band of the transmission circuit is lower than a frequency pass band of the reception circuit, and
    wherein a resonant frequency of the bias circuit is less than a frequency pass band width of the transmission circuit.

2. The high-frequency front end circuit according to claim 1,
    wherein the first end of the bias circuit is connected to the signal path between the amplification element and the output terminal.

3. The high-frequency front end circuit according to claim 2, further comprising an output matching circuit in the signal path between the amplification element and the output terminal,
    wherein the first end of the bias circuit is connected to the signal path between the amplification element and the output matching circuit.

4. The high-frequency front end circuit according to claim 1,
    wherein the transmission circuit further comprises at least one additional amplification circuit, the first amplification circuit and the at least one additional amplification circuit being connected in a multistage arrangement,
    wherein the first amplification circuit is the closest amplification circuit to the antenna terminal.

5. The high-frequency front end circuit according to claim 1, comprising a plurality of the first amplification circuits connected in a multistage arrangement.

6. The high-frequency front end circuit according to claim 1, wherein the first end of the bias circuit is connected to the signal path between the input terminal and the amplification element.

\* \* \* \* \*